(12) United States Patent
Jiang

(10) Patent No.: US 12,591,718 B2
(45) Date of Patent: Mar. 31, 2026

(54) APPLICATION DEVELOPMENT PLATFORM, MICRO-PROGRAM GENERATION METHOD, AND DEVICE AND STORAGE MEDIUM

(71) Applicant: BOE Technology Group Co., Ltd., Beijing (CN)

(72) Inventor: Sujia Jiang, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 243 days.

(21) Appl. No.: 18/282,232

(22) PCT Filed: Jan. 10, 2023

(86) PCT No.: PCT/CN2023/071490
§ 371 (c)(1),
(2) Date: Sep. 15, 2023

(87) PCT Pub. No.: WO2023/138435
PCT Pub. Date: Jul. 27, 2023

(65) Prior Publication Data
US 2024/0160410 A1     May 16, 2024

(30) Foreign Application Priority Data
Jan. 24, 2022    (CN) .......................... 202210082352.0

(51) Int. Cl.
*G06F 8/34* (2018.01)
*G06F 8/20* (2018.01)
(Continued)

(52) U.S. Cl.
CPC ................ *G06F 30/12* (2020.01); *G06F 8/20* (2013.01); *G06F 8/34* (2013.01); *G06F 9/453* (2018.02); *G06Q 30/0621* (2013.01)

(58) Field of Classification Search
CPC ..... G06Q 30/0621; G06F 9/453; G06F 30/12; G06F 8/34; G06F 8/36
See application file for complete search history.

(56) References Cited

U.S. PATENT DOCUMENTS

| | | | |
|---|---|---|---|
| 2009/0007008 A1* | 1/2009 | Wan ........................ | G06F 9/453 |
| | | | 715/805 |
| 2009/0150773 A1 | 6/2009 | Falkner et al. | |

(Continued)

FOREIGN PATENT DOCUMENTS

| | | |
|---|---|---|
| CN | 109739497 A | 5/2019 |
| CN | 110020356 A | 7/2019 |

(Continued)

OTHER PUBLICATIONS

Marc Andrew, "Prototyping with Sketch & Principle" Feb. 20, 2017, 28 pgs <sketchPrototyping.pdf>.*

(Continued)

*Primary Examiner* — Tuan A Vu
(74) *Attorney, Agent, or Firm* — Ling Wu; Stephen Yang; Ling and Yang Intellectual Property

(57) ABSTRACT

An application development platform, a micro-program generation method, and a device and a storage medium. The application development platform comprises: a micro-program center and a visualized configuration system, wherein the micro-program center is configured to obtain a SKETCH file of a design page; the visualized configuration system is configured to display a first configuration interface for configuring a panel, acquire a plurality of panels which are configured by a user by means of the first configuration interface and correspond to the design page, and parse the SKETCH file, so as to obtain layout information of a target page corresponding to the design page; and the micro-program center is further configured to stitch the plurality of (Continued)

panels on the basis of the layout information of the target page, so as to generate a micro-program which can implement the target page.

16 Claims, 10 Drawing Sheets

(51) Int. Cl.
| | | |
|---|---|---|
| *G06F 30/12* | (2020.01) | |
| *G06F 9/451* | (2018.01) | |
| *G06Q 30/0601* | (2023.01) | |

(56) References Cited

U.S. PATENT DOCUMENTS

| | | | | |
|---|---|---|---|---|
| 2015/0066189 A1* | 3/2015 | Mulligan | ........... | G06Q 30/0621 |
| | | | | 700/136 |
| 2021/0157471 A1* | 5/2021 | Nishimoto | .............. | G06F 30/12 |

FOREIGN PATENT DOCUMENTS

| | | | |
|---|---|---|---|
| CN | 112015501 | A | 12/2020 |
| CN | 113485708 | A | 10/2021 |
| CN | 114416069 | A | 4/2022 |

OTHER PUBLICATIONS

Zhao et al, CN 112214218 (translation), Jan. 12, 2021, 7 pgs <CN_112214218.pdf>.*
Chen, Cheng-Hua, CN 107818213 (translation), Mar. 19, 2021, 11 pgs <CN_107818213.pdf>.*
Zhao et al, CN 113626023A(translation) Nov. 9, 2021, 16 pgs <CN_113626023A.pdf>.*
Learn Design, "Open format: how Sketch's open file format can supercharge your workflows", Jan. 4, 2022, 10 pgs < SketchOpenfile. pdf>.*
JP 6944548 (translation), Oct. 6, 2021, 38 pgs <JP_6944548.pdf>.*
International Search Report for PCT/CN2023/071490 Mailed May 19, 2023.

* cited by examiner

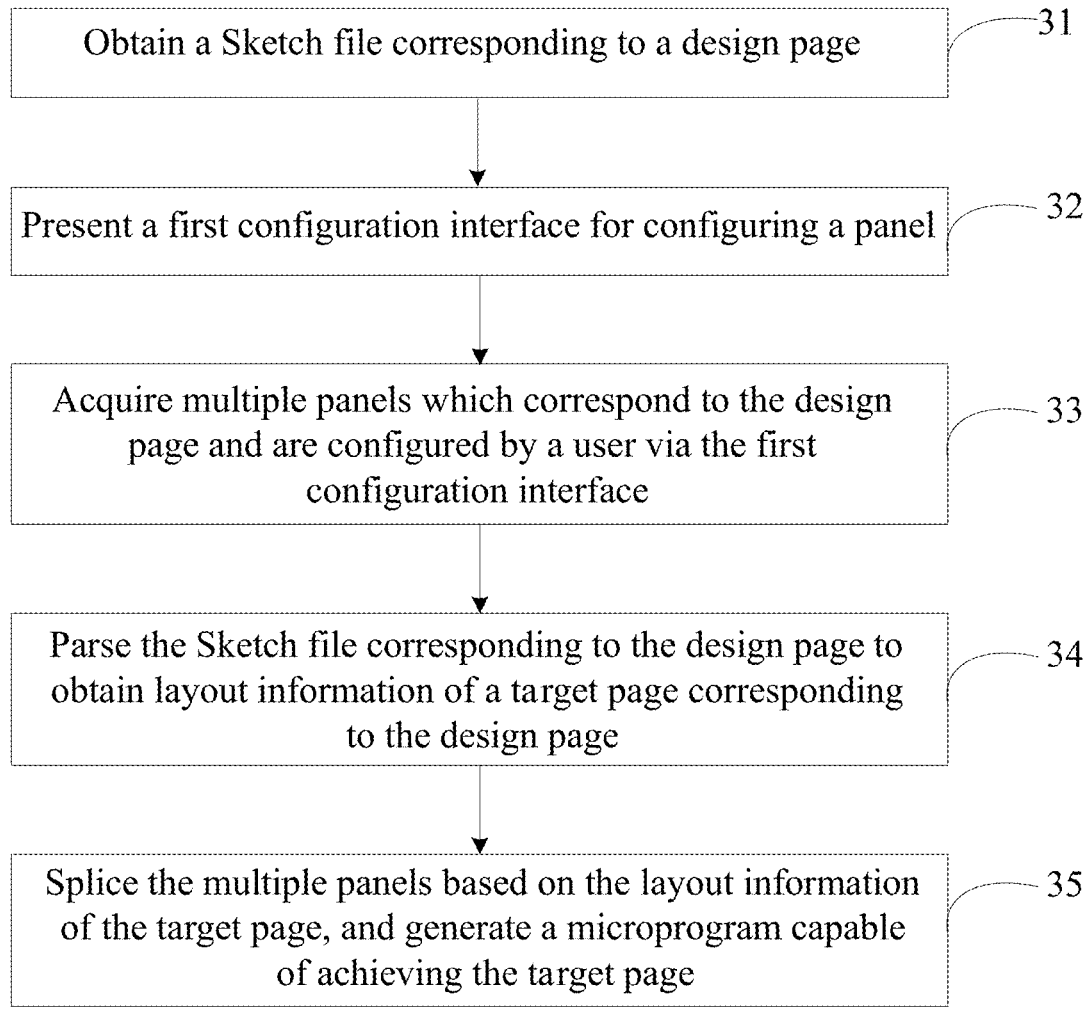

Obtain a Sketch file corresponding to a design page ⌐31

Present a first configuration interface for configuring a panel ⌐32

Acquire multiple panels which correspond to the design page and are configured by a user via the first configuration interface — 33

Parse the Sketch file corresponding to the design page to obtain layout information of a target page corresponding to the design page — 34

Splice the multiple panels based on the layout information of the target page, and generate a microprogram capable of achieving the target page — 35

FIG. 3

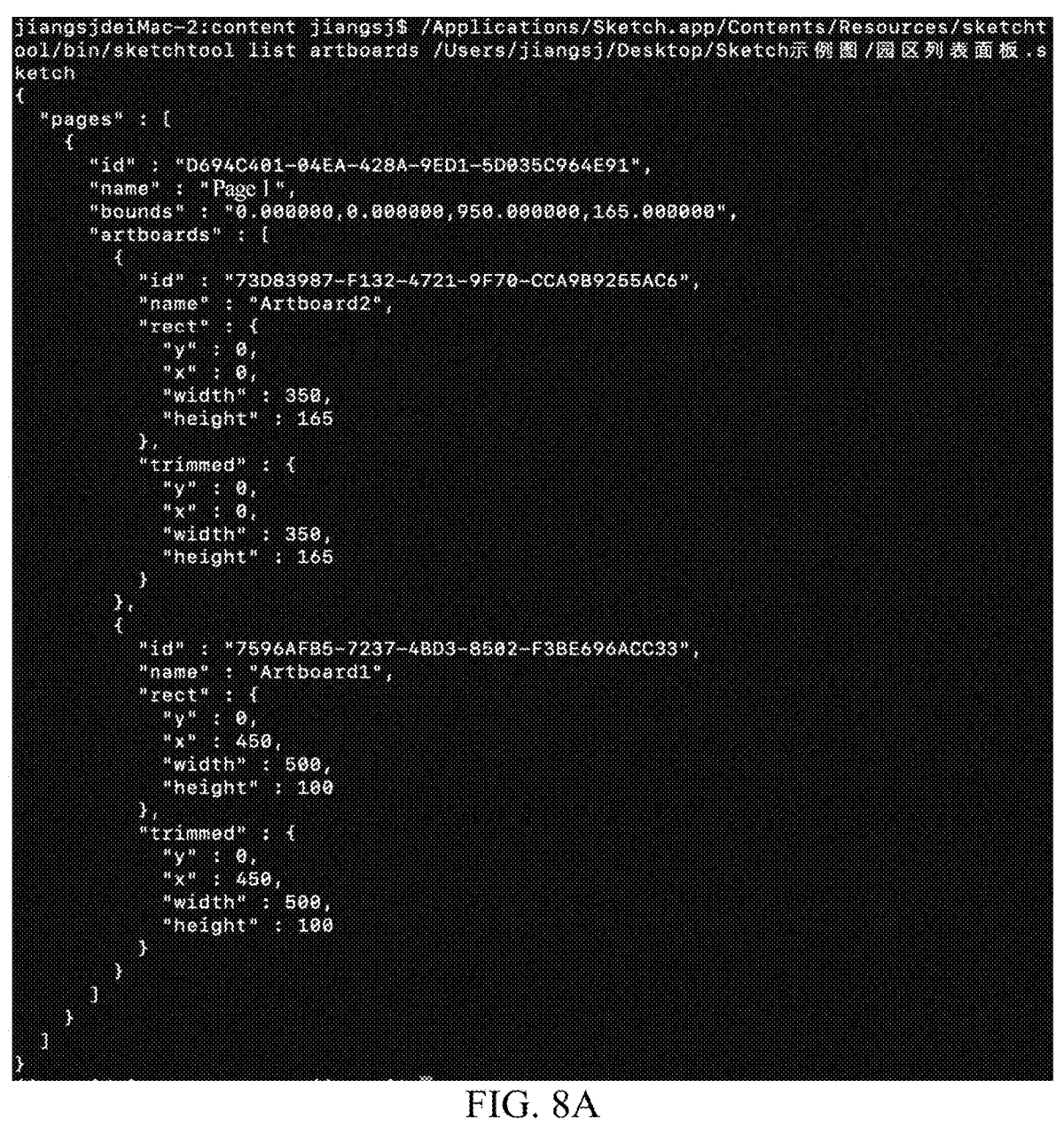

```
jiangsjdeiMac-2:content jiangsj$ /Applications/Sketch.app/Contents/Resources/sketcht
ool/bin/sketchtool list artboards /Users/jiangsj/Desktop/Sketch示例图/园区列表面板.s
ketch
{
  "pages" : [
    {
      "id" : "D694C401-04EA-428A-9ED1-5D035C964E91",
      "name" : "Page 1",
      "bounds" : "0.000000,0.000000,950.000000,165.000000",
      "artboards" : [
        {
          "id" : "73D83987-F132-4721-9F70-CCA9B9255AC6",
          "name" : "Artboard2",
          "rect" : {
            "y" : 0,
            "x" : 0,
            "width" : 350,
            "height" : 165
          },
          "trimmed" : {
            "y" : 0,
            "x" : 0,
            "width" : 350,
            "height" : 165
          }
        },
        {
          "id" : "7596AFB5-7237-4BD3-8502-F3BE696ACC33",
          "name" : "Artboard1",
          "rect" : {
            "y" : 0,
            "x" : 450,
            "width" : 500,
            "height" : 100
          },
          "trimmed" : {
            "y" : 0,
            "x" : 450,
            "width" : 500,
            "height" : 100
          }
        }
      ]
    }
  ]
}
```

FIG. 8A

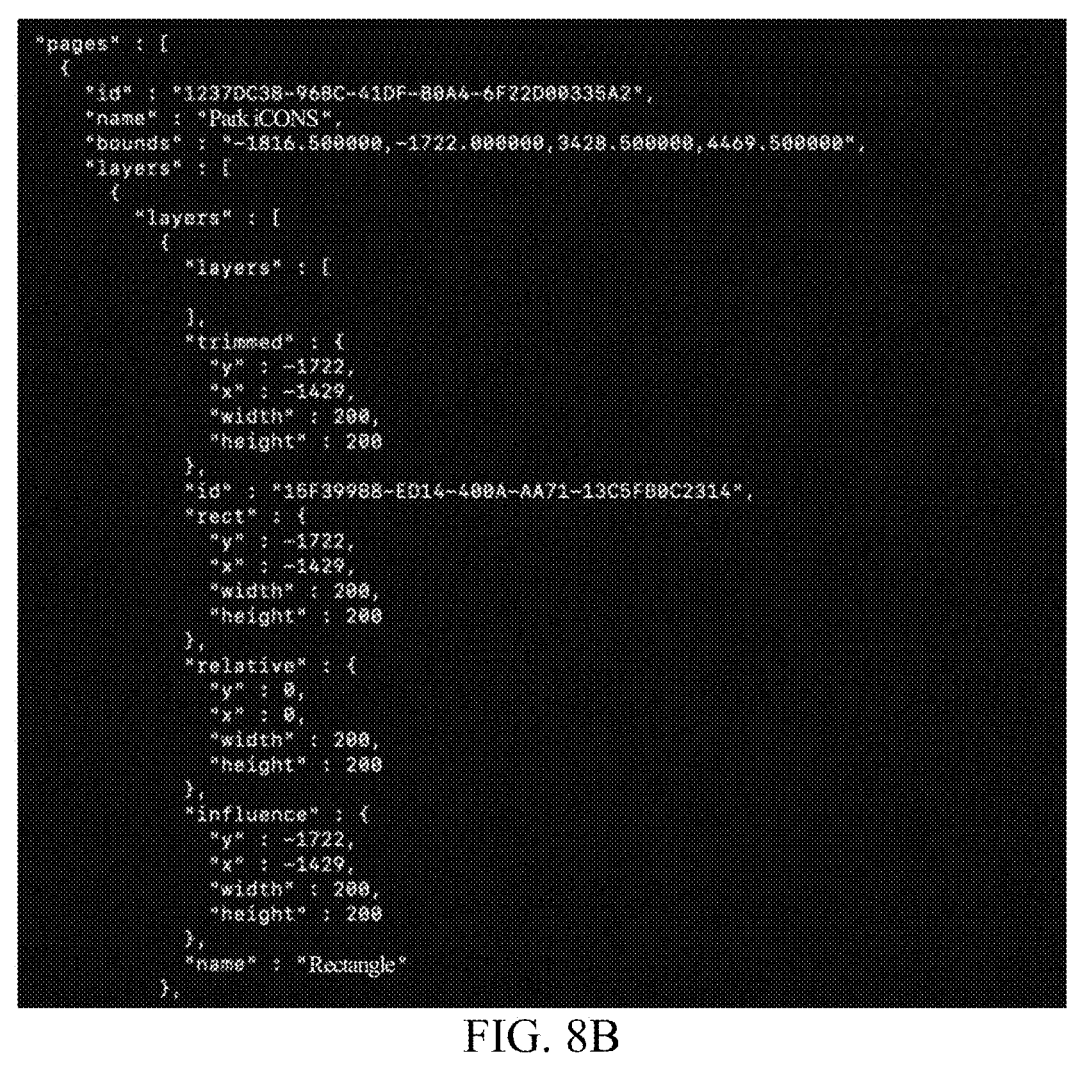

```
"pages" : [
  {
    "id" : "1237DC38-968C-41DF-80A4-6F72D00335A2",
    "name" : "Park iCONS",
    "bounds" : "-1816.500000,-1722.000000,3428.500000,4469.500000",
    "layers" : [
      {
        "layers" : [
          {
            "layers" : [

],
            "trimmed" : {
              "y" : -1722,
              "x" : -1429,
              "width" : 300,
              "height" : 200
            },
            "id" : "16F39988-ED14-400A-AA71-13C5F80C2314",
            "rect" : {
              "y" : -1722,
              "x" : -1429,
              "width" : 300,
              "height" : 200
            },
            "relative" : {
              "y" : 0,
              "x" : 0,
              "width" : 200,
              "height" : 200
            },
            "influence" : {
              "y" : -1722,
              "x" : -1429,
              "width" : 200,
              "height" : 200
            },
            "name" : "Rectangle"
          },
```

FIG. 8B

APPLICATION DEVELOPMENT PLATFORM, MICRO-PROGRAM GENERATION METHOD, AND DEVICE AND STORAGE MEDIUM

CROSS-REFERENCE TO RELATED APPLICATIONS

The present application is a U.S. National Phase Entry of International Application No. PCT/CN2023/071490 having an international filing date of Jan. 10, 2023, which claims priority of Patent Application No. 202210082352.0 filed to the CNIPA on Jan. 24, 2022, and entitled "Application Development Platform, Micro-program Generation Method, and Device and Storage Medium". The above-identified applications are hereby incorporated by reference in their entireties.

TECHNICAL FIELD

Embodiments of the present disclosure relates to, but are not limited to, a technical field of computers, in particular to an application development platform, a method for generating a microprogram, a device and a storage medium.

BACKGROUND

Sketch is a design tool, and has advantages, such as easy to learn, and rich in functions. It is widely used in graphic design, Internet, computer and other fields. At present, in a process of application development, the designer designs a design page through Sketch, and provides a Sketch file of the design page to the developer, and then the developer produces page components according to the contents of the Sketch file and splices them manually. In this way, in the process of page development, it needs to perform a secondary development in order to achieve truly available pages in applications, which has a problem of low development efficiency.

SUMMARY

The following is a summary of subject matter described herein in detail. The summary is not intended to limit the protection scope of claims.

In a first aspect, an embodiment of the present disclosure provides an application development platform, including: a microprogram center and a visual configuration system. The microprogram center is configured to obtain a Sketch file of a design page. The visual configuration system is configured to present a first configuration interface for configuring a panel, acquire multiple panels which correspond to the design page and are configured by a user via the first configuration interface, parse the Sketch file to obtain layout information of a target page corresponding to the design page. The microprogram center is further configured to splice the multiple panels based on the layout information of the target page and generate a microprogram capable of achieving the target page.

In a second aspect, an embodiment of the present disclosure provides a method for generating a microprogram, which is applied to an application development platform. The method includes: obtaining a Sketch file of a design page; presenting a first configuration interface for configuring a panel; acquiring multiple panels which correspond to the design page and are configured by a user via the first configuration interface; parsing the Sketch file to obtain layout information of a target page corresponding to the design page; and splicing the multiple panels based on the layout information of the target page and generating a microprogram capable of achieving the target page.

In a third aspect, an embodiment of the present disclosure provides a computer device, including: a processor and a memory storing a computer program that is runnable on the processor, wherein steps of the method for generating the microprogram described in the above embodiments are implemented when the processor executes the program.

In a fourth aspect, an embodiment of the present disclosure provides a computer-readable storage medium including a stored program, wherein the acts of the method for generating the microprogram described in the above embodiments are implemented when the program is run.

Other features and advantages of the present disclosure will be set forth in following specification, and moreover, partially become apparent from the specification or are understood by implementing the present disclosure. Other advantages of the present disclosure may be achieved and obtained through solutions described in the specification and drawings.

Other aspects may be understood upon reading and understanding the drawings and detailed description.

BRIEF DESCRIPTION OF DRAWINGS

Accompanying drawings are used for providing understanding of technical solutions of the present disclosure, and form a part of the specification. They are used for explaining the technical solutions of the present disclosure together with embodiments of the present disclosure, but do not form limitation on the technical solutions of the present disclosure. Shapes and sizes of components in the drawings do not reflect actual scales, and are only intended to schematically illustrate contents of the present disclosure.

FIG. 3 is a first schematic flowchart of a method for generating a microprogram according to an exemplary embodiment of the present disclosure.

FIG. 8A is a first schematic diagram of layout information of a target page exported according to an exemplary embodiment of the present disclosure.

FIG. 8B is a second schematic diagram of layout information of a target page exported according to an exemplary embodiment of the present disclosure.

DETAILED DESCRIPTION

Figure 1:
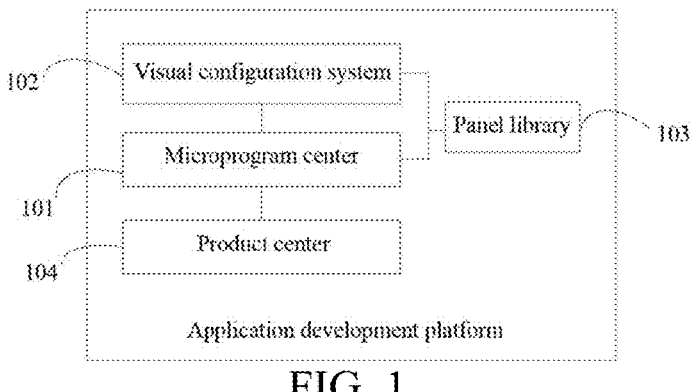
FIG. 1 is a schematic diagram of an architecture of an application development platform according to an exemplary embodiment of the present disclosure.

Multiple embodiments are described herein, but the description is exemplary rather than restrictive, and there may be more embodiments and implementation solutions within the scope contained in the embodiments described herein. Although many possible feature combinations are shown in the drawings and discussed in exemplary implementation modes, many other combinations of disclosed features are also possible. Unless expressly limited, any feature or element of any embodiment may be used in combination with, or may replace, any other feature or element in any other embodiment.

When representative embodiments are described, the specification may have presented methods and/or processes as a specific order of acts. However, the method or the process should not be limited to the acts with the specific order on a premise that the method or the process is independent of the specific order of the acts described herein. Those of ordinary skills in the art will understand that other orders of acts may also be possible. Therefore, the specific order of the acts illustrated in the specification should not be interpreted as limitation on claims. Moreover, the claims directed to the method and/or process should not be limited to performing their acts in the described order, and those skilled in the art will readily understand that these orders may be varied and still remain within the spirit and scope of the embodiments of the present disclosure.

Unless otherwise defined, technical terms or scientific terms used in the embodiments shall have common meanings understood by people with ordinary skills in the field to which the present disclosure pertains. "First", "second", and similar terms used in the embodiments of the present disclosure do not represent any order, quantity, or importance, but are only used for distinguishing different components. Terms such as "include" or "contain" mean that an element or an object appearing before the term includes elements or objects listed after the term or their equivalents, and does not exclude other elements or objects. "Connection", "mutual connection", or a similar term is not limited to a physical or mechanical connection, but may include an electrical connection, whether direct or indirect.

In order to facilitate better understanding of technical solutions of the present disclosure by those skilled in the art, technical terms that may be involved in exemplary embodiments of the present disclosure are briefly described below.
(1) Sketch, Sketch Plug-In and SketchTool The Sketch is a design tool.

The Sketch plug-in refers to Sketch software that is set up in a plug-in form.

The SketchTool is a command-line utility tool that may be installed and bundled with Sketch. Operations such as parsing a Sketch file, exporting a Sketch resource, or checking a Sketch file, or calling Sketch, may be handled through the SketchTool. For example, the Sketch resources may include: a page, a Canva, an Artboard, or a Layer, and so on. Among them, The Canva refers to a painting region used to draw visual elements such as graphics, characters and images in Sketch to form a page; a dimension of the canva may be unlimited, and a user can drag it in any direction at will; and one Artboard or multiple Artboard may be inserted onto one Canva. The Artboard refers to a designated painting region in the Canva, one or more combinations of visual elements such as graphics, characters and images to form a panel; and a dimension of the Artboard is limited, and the Artboard may have a fixed frame. The Layer is the most basic composition unit in the Sketch, and every object (such as a Canva, an Artboard, etc.) in the Sketch has its own Layer. The Layer may include a text layer, a graphic layer, etc. The graphic with a complex shape may be formed by combining multiple graphics with simple shapes, and correspondingly, a Layer of a graphic with a complex shape may be formed by combining multiple layers of graphics with simple shapes.
(2) Operating System (OS)

The Operating System is a computer program that manages computer hardware and software resources. The Operating system may handle basic transactions, such as managing and configuring memory, determining priority of system resource supply and demand, controlling input and output devices, or operating networks and managing file systems. For example, the common operating systems on the mobile terminals may include Android operating system or iOS operating system, or the like, and at present, the common operating systems on server sides and computer sides may include Linux operating system, Windows operating system or UNIX operating system or the like. Correspondingly, the application may include an Android application, an iOS application, or a Windows application, etc.
(3) Flutter, DSL (Domain Specific Language) and JSON (JavaScript Object Notation, JS)

The Flutter is a cross-platform User Interface (UI) development framework, which may build high-quality native user interfaces on a variety of operating systems through a set of codebases. For example, the variety of operating systems may include Android operating systems, or iOS operating systems, and so on. When an Application (APP) is developed based on the operating system, the user interface may be developed with the Flutter. In a practical application stage of APP, the user interface may be presented through tool classes provided by the Flutter and tool classes provided by the operating system. The cross-platform user interface may refer to a user interface suitable for the Android operating system, the iOS operating system, or the Windows operating system, and so on.

DSL is a syntax rule that allows domain experts to describe the rules in a domain in a simple programmatic way.

JSON is a lightweight data format, which is easy to read and write by users, and easy to parse and generate by machines.
(4) Application (APP), Interface and Page The Application, that is, an application program, refers to a computer program for completing a certain or more specific tasks, which is run in a user mode, may interact with users, and generally has a visual user interface. For example, the Applications may include, but are not limited to, applications suitable for operating systems such as iOS, Android, Web, Windows, macOS, or Linux. For example, one Application may implement one or more functions, and one function may be split into one or more sub-functions. For example, one Application may include multiple interfaces. For example, one application may include multiple pages.

The Interface is a medium interface for transmitting and exchanging information between users and machines (for example, computer devices), and is a collection for supporting software, hardware and methods for bidirectional information interactions between users and machines (for example, computer devices), and achieves a conversion between an internal form of information and an acceptable form of users. A common form of the interface is Graphic User Interface (GUI), which is an operation-related user interface that is displayed in a graphic way. For example, one interface may include one or more page implementations. For example, switch between multiple pages may be implemented by binding components (such as navigation bars, etc.) to the multiple pages.

The page refers to contents presented in the interface of an interaction process between users and machines.

(5) Low Code

The low code means that in a process of quickly creating, by a user, an application based on the application development platform, the user (for example, developer) may complete most of the development work with more efficient visual development manners such as dragging, clicking, or parameter configuration, without a lot of coding.

(6) Module, Center and System

The module, center, and system may refer to any known or later developed hardware, software, firmware, artificial intelligence, fuzzy logic, or combination of hardware or/and software code capable of performing related functions.

Exemplary embodiments of the present disclosure provide an application development platform. The application development platform is a visual development system which may solve a problem of human efficiency based on low code engineering of Flutter and Sketch, may provide management services for products such as panels, microprograms or applications, may provide visual configuration services, and may provide services for forming cross-platform applications by packaging based on microprograms. It can quickly generate applications suitable for different operating systems based on microprograms. Therefore, it can improve the development efficiency and reduce the development cost, and has a wide application prospect.

In an exemplary embodiment, the application development platform may include a microprogram center and a visual configuration system. The microprogram center is configured to obtain a Sketch file of a design page. The visual configuration system is configured to present a first configuration interface for configuring a panel, acquire multiple panels which correspond to the design page and are configured by a user via the first configuration interface, and parse the Sketch file to obtain layout information of a target page corresponding to the design page. The microprogram center is further configured to splice the multiple panels based on the layout information of the target page and generate a microprogram capable of achieving the target page. In this way, a user (for example, a developer, a product manager, a project manager, a tester, etc.) is only required to utilize the visual configuration to generate multiple panels corresponding to a design page without manual splicing by the user, and through layout information of the target page parsed from the Sketch file of the design page, a microprogram for achieving the target page corresponding to the design page may be quickly generated by splicing the multiple panels configured by the user through the visual configuration. Thus, when this microprogram is applied to a scene of developing an Application, it can improve a development efficiency and reduce a development cost, lowers a use threshold and has a wide application prospect.

In an exemplary embodiment, a visual configuration system is configured to acquire an Artboard configured by a user through a Sketch plug-in on a first configuration interface, generate a corresponding panel through a cross-platform development framework according to the Artboard configured by the user; wherein a style of the Artboard is the same as that of corresponding panel. The Artboard is a page component based on the Sketch, the panel is a page component based on the cross-platform development framework, and the target page is a page based on the cross-platform development framework.

In an exemplary embodiment, the application development platform may further include: a panel library, wherein the panel library is configured to store panels; the visual configuration system, is configured to present a second configuration interface for presenting the panel library, acquire a panel to be modified that is selected by the user from the panel library on the second configuration interface, display an Artboard to be modified corresponding to the panel to be modified on the first configuration interface through the Sketch plug-in, and generate and present the Artboard configured by the user in response to a use's operation for modifying the Artboard to be modified on the first configuration interface. In this way, by making simple modifications, the panel can be generated quickly.

In an exemplary embodiment, the visual configuration system is configured to display modifiable parameters of the Artboard to be modified and a corresponding first control for modifying parameter values of the modifiable parameters on the first configuration interface, generate and present the Artboard configured by the user according to the parameter values of the modifiable parameters of the Artboard to be modified and the modified parameter values in response to a user's operation performed on the first control; wherein the modifiable parameters include one or more of a graphic, a text, a numeric value, a color, a dimension, and a data source.

In an exemplary embodiment, the visual configuration system is configured to generate a corresponding panel through the cross-platform development framework based on the Artboard configured by the user in response to a user's operation performed on a second control displayed on a first configuration interface for generating the panel.

In an exemplary embodiment, the visual configuration system is configured to perform a binding processing on a panel in response to a binding operation for the panel by a user prior to generating the microprogram, wherein the binding processing for the panel includes at least one of a data binding on the panel, an event binding on the panel, and a component binding on the panel.

In an exemplary embodiment, the application development platform may further include a product center, which is configured to acquire one or more microprograms from the microprogram center, generate a cross-platform application based on the one or more microprograms; wherein the cross-platform application generates target pages suitable for different operating systems when the cross-platform application is run on different operating systems.

For example, the cross-platform application refers to an application suitable for platforms such as iOS, Android, Web, Windows, macOS, or Linux. Here, no limitation is made thereto in embodiments of the present disclosure.

In an exemplary embodiment, the product center is configured to acquire one or more microprograms from a microprogram center, and generate a cross-platform application corresponding to a preset operating system based on the one or more microprograms.

For example, the preset operating system may be preset by the user, or may be automatically set by the application development platform. Here, no limitation is made thereto in embodiments of the present disclosure.

For example, when the user expects to generate an iOS application based on the application development platform, the preset operating system may be an iOS operating system, and in this case, the application development platform may generate an iOS application according to the microprogram. When the user expects to generate an Android application based on the application development platform, the preset operating system may be an Android operating system, and in this case, the application development platform may generate an Android application according to the micropro- gram.

FIG. 1 is a schematic diagram of an architecture of an application development platform according to an exem- plary embodiment of the present disclosure. As shown in FIG. 1, the application development platform may include a microprogram center 101, a visual configuration system 102, a panel library 103, and a product center 104.

In an exemplary embodiment, the microprogram center may provide services such as generation, management, retrieval, or storage of the microprograms; the visual con- figuration system may provide visual configuration services for the products such as panels, pages or microprograms; and the panel library may provide services such as panel management, retrieval, or storage, and the product center may provide services such as generation, management, retrieval, or storage of applications.

In an exemplary embodiment, the microprogram may refer to a reusable file developed on the basis of a Flutter dynamic DSL framework, which may include code blocks of one or more cross-platform pages, and one or more cross- platform pages may be achieved when the microprogram is running. The cross-platform pages may refer to pages devel- oped on the basis of the Flutter dynamic DSL framework, thus it may facilitate classification management and avoid repeated development workload. For example, one micro- program may be packaged separately to generate one appli- cation, or multiple microprograms may be packaged together to generate one application. For example, taking a smart city as an example, it may be divided into a smart park, a smart office, a smart home or a smart transportation according to the scenes. One smart city application may be generated by packaging microprograms, such as micropro- grams for achieving the smart park and the smart office, and the like. For another example, taking a microprogram for achieving a punch-in function as an example, one confer- ence application may provide employee sign-in service by packaging the microprogram for achieving the punch-in function, or one factory application may provide factory visitor management service by packaging a microprogram for achieving the punch-in function.

In an exemplary embodiment, the visual configuration system may mean that based on the Flutter and DSL framework, the upper layer involves the Sketch plug-in and binds the SketchTool, provides visual configuration page components (e.g., panels), or services of parsing the Sketch files, etc. In this way, users (for example, developers) may complete most of their development work through more efficient visual development manners such as dragging, clicking, or parameter configuring.

In an exemplary embodiment, the panel library may refer to a set of panels. The panel may refer to reusable code blocks of the page components developed based on the Flutter dynamic DSL framework, thus it may facilitate classification management and avoid repeated development workload. For example, the panel may include, but is not limited to, a broken line graph panel, a Pie chart (Pie) panel, a list panel, an annular scale distribution graphs panel, a bar diagram panel, a title panel, a slideshow panel, a button panel, a system announcement panel, a text panel, and the like. For example, one panel may be laid out to implement one page separately, and multiple panels may be laid out or spliced to implement one page.

Figure 2:
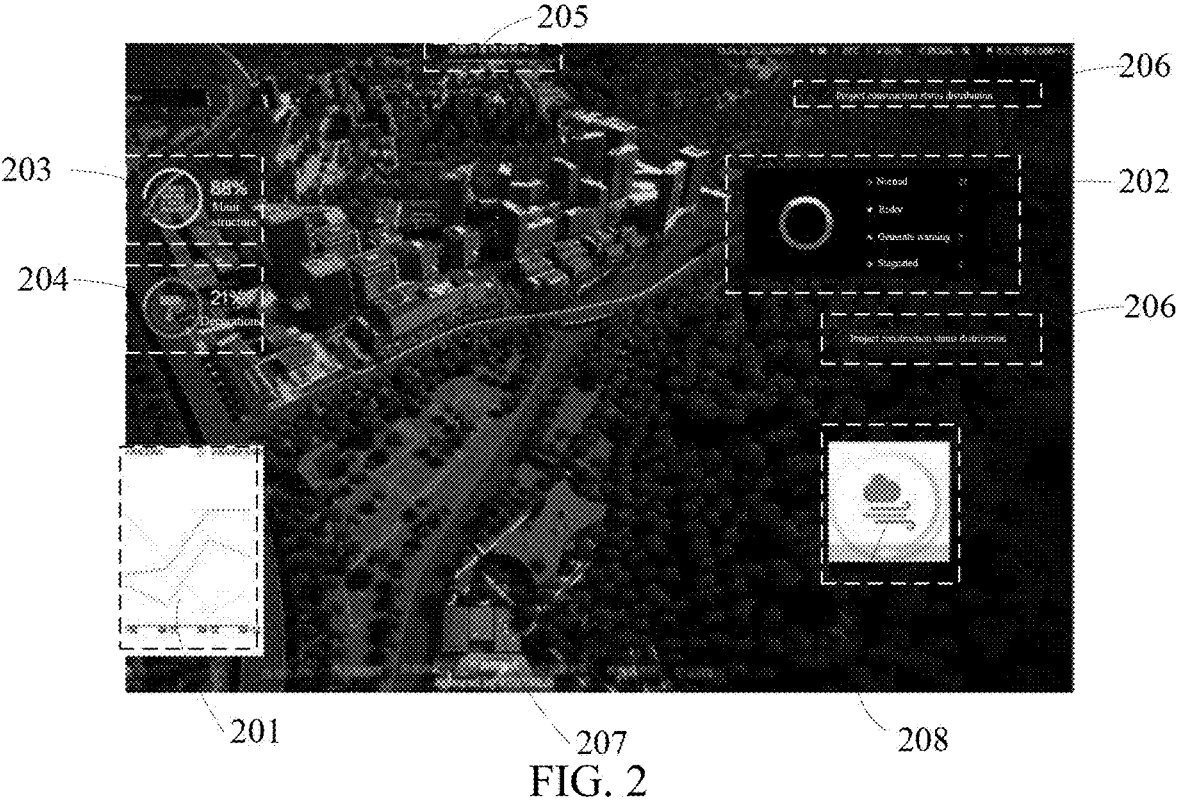
FIG. 2 is a schematic diagram of a design page according to an exemplary embodiment of the present disclosure.

For example, taking the design page being a design page of a smart park as an example, as shown in FIG. 2, the design page of the smart park may include a broken line graph panel 201 for presenting security risks, a first annular scale dis- tribution graph panel 202 for presenting a status distribution of construction items, a second annular scale distribution graph panel 203 for presenting a construction progress of a main structure, a third annular scale distribution graph panel 204 for presenting a construction progress of decorations, a first title panel 205 for presenting a name of the park, a second title panel 206 for presenting a name of the first annular scale distribution graph panel, a first picture panel 207 for presenting a picture of the park, and a second picture panel 208 for presenting the weather of the park.

An exemplary embodiment of the present disclosure provides a method for generating a microprogram, which may be applied to the application development platform in one or more of the above exemplary embodiments. The method for generating the microprogram provided by an embodiment of the present disclosure is described below in connection with the above application development plat- form.

FIG. 3 is a first schematic flowchart of a method for generating a microprogram according to an exemplary embodiment of the present disclosure. As shown in FIG. 3, the method for generating a microprogram may include following acts 31-35.

At act 31, a Sketch file for a design page is obtained, and the target page includes multiple panels.

At act 32, a first configuration interface for configuring a panel is presented.

At act 33, multiple panels which correspond to the design page and are configured by the user via the first configuration interface are acquired.

At act 34, the Sketch file of the design page is parsed to obtain layout information of the target page corre- sponding to the design page.

At act 35, the multiple panels are spliced based on the layout information of the target page to generate a microprogram capable of achieving the target page.

Therefore, a user (for example, a developer, a product manager, a project manager, a tester, etc.) is only required to utilize the visual configuration to generate multiple panels corresponding to a design page without manual splicing by the user, and through layout information of the target page parsed from the Sketch file of the design page, a micropro- gram for achieving the target page corresponding to the design page may be quickly generated by splicing the multiple panels configured by the user through the visual configuration. Thus, when this microprogram is applied to a scene of developing an Application, it can improve a devel- opment efficiency and reduce a development cost, lowers a use threshold and has a wide application prospect.

For example, taking a case where the design page is the design page of the smart park shown in FIG. 2 and the microprogram can achieve the target page corresponding to the design page of the smart park shown in FIG. 2 as an example, after the designer designs the design page of the smart park through Sketch, the designer may upload the Sketch file of the design page of the smart park to the microprogram center through an interface provided by the microprogram center. Then, since the microprogram center is bound with the visual configuration system, the microprogram center may send the Sketch file of the design page of the smart park to the visual configuration system. Next, the visual configuration system may parse the Sketch file of the design page of the smart park, obtain the layout information of the target page corresponding to the design page of the smart park, and send the layout information of the target page corresponding to the design page of the smart park to the microprogram center. Moreover, the visual configuration system may present the first configuration interface for configuring the panel to the user (for example, the developer, the product manager, the project manager or the tester, etc.), such that the user may perform a visual configuration to produce multiple panels corresponding to the design page of the smart park by comparing the Sketch file through the visual configuration system, and thus the multiple panels corresponding to the design page of the smart park configured by the user may be obtained through the visual configuration system. As shown in FIG. 2, the multiple panels corresponding to the design page of the smart park configured by the user may include: a broken line graph panel 201 for presenting security risks, a first annular scale distribution graph panel 202 for presenting a status distribution of construction items, a second annular scale distribution graph panel 203 for presenting a construction progress of a main structure, a third annular scale distribution graph panel 204 for presenting a construction progress of decorations, a first title panel 205 for presenting a name of the park, a second title panel 206 for presenting a name of the first annular scale distribution graph panel, a first picture panel 207 for presenting a picture of the park, and a second picture panel 208 for presenting the weather of the park. Therefore, the microprogram center may acquire the multiple panels corresponding to the design page of the smart park through the visual configuration system. In this way, the microprogram center may splice the multiple panels corresponding to the design page of the smart park according to the parsed layout information of the target page corresponding to the design page of the smart park, thereby generating a microprogram capable of achieving the target page corresponding to the design page of the smart park.

In an exemplary embodiment, a User Interface (UI) designer may design a certain application by using a Sketch tool according to a design concept of the page development of the application, and obtain a Sketch file of the design page. Then, the Sketch file of the design page is uploaded to the microprogram center through an entrance provided by the microprogram center of the application development platform. In this way, the microprogram center obtains the Sketch file of the design page.

In an exemplary embodiment, the sketch file of the design page may refer to a file of the design page in a format of .sketch.

In an exemplary embodiment, the data format of the microprogram may adopt a JSON data format based on DSL description.

In an exemplary embodiment, the content of the microprogram may include, but is not limited to, basic information, DSL-JSON data of a page, and may further include information such as visual configuration screenshots of the microprogram. The basic information may include, but is not limited to, information such as name, version number, application type, resolution, or service attributes. The DSL-JSON data of the page may include, but is not limited to, JSON data (that is, strings describing panels) of all panels within the page and an entire DSL-JSON file of the layout information of the page. The layout information of the page may include: position information of each panel in the page, hierarchical structure information among all panels in the page, hierarchical structure information among multiple pages, and the like. Here, no limitation is made thereto in embodiments of the present disclosure.

In one exemplary embodiment, the act 33 may include acts 331 to 332 as follows.

At act 331, an Artboard configured by the user is obtained through the Sketch plug-in on the first configuration interface.

At act 332, a panel corresponding to the Artboard configured by the user is generated through the cross-platform development framework according to the Artboard configured by the user. In this way, the panel corresponding to the design page configured by the user via the first configuration interface is obtained.

Herein, a style of the Artboard configured by the user is the same as that of the corresponding panel generated by the cross-platform development framework, the Artboard is a page component based on the Sketch, the panel is a page component based on the cross-platform development framework, and the target page is a page based on the cross-platform development framework. In this way, the page component based on the Sketch (i.e. the Artboard) visually configured by the user via the first configuration interface may be converted, through the visual configuration system, into a page component based on the cross-platform development framework (i.e. the panel) which can suitable for different operating systems. Thereby, a process of generating panels by users through visual configuration is achieved.

Herein, the style defines how the page elements are displayed.

In an exemplary embodiment, the cross-platform development framework may include Flutter and DSL, and the panel may be a page component based on the Flutter and the DSL. In this way, the target page which may be achieved based on the panel is a cross-platform page. The cross-platform page may refer to a page suitable for the Android operating system, the iOS operating system, or the Windows operating system, etc.

In an exemplary embodiment, the description data of the Artboard may adopt a JSON data format, and the description data of the panel may adopt a JSON data format.

In an exemplary embodiment, the act 331 may include act 3311 to 3314.

At act 3311, a second configuration interface for presenting the panel library is presented.

At act 3312, a panel to be modified that is selected by the user from the panel library on the second configuration interface is acquired.

At act 3313, an Artboard to be modified corresponding to the panel to be modified is displayed on the first configuration interface through a Sketch plug-in. Herein, a style of the Artboard to be modified is the same as that of the panel to be modified.

At act 3314, an Artboard configured by a user is generated and presented in response to a user's operation on the first configuration interface for modifying the Artboard to be modified.

In an exemplary embodiment, a style of the panel to be modified is similar to the that of the design page. For example, the similarity may mean that the panel to be modified contains the largest number of page elements of the same style as those in the design page. Herein, the page elements may be UI elements of the smallest unit in a page, such as a text, an icon, a button, a label, or a list.

For example, taking a case where a certain combination of page elements in a design page includes a first page element of a first style, a second page element of a second style, a third page element of a third style, and a fourth page element of a fourth style as an example, when the panel library includes a first panel and second panel of a same type, wherein the first panel includes the first page element of the first style, and a second page element of a fifth style, which is different from the second page element of the second style, and the second panel includes the second page element of the second style and the third page element of the third style, the second panel contains a larger number of page elements of the same style as the design page relative to the first panel, so that the second panel may be selected as the panel to be modified, thereby facilitating the user to generate the panel through less modification.

In an exemplary embodiment, the act 3314 may include: displaying modifiable parameters of an Artboard to be modified and a corresponding first control for modifying parameter values of the modifiable parameters on a first configuration interface; generating and presenting the Artboard configured by the user according to the parameter values of the modifiable parameters of the Artboard to be modified and the modified parameter values in response to user's operation on the first control; wherein the modifiable parameters include one or more of a graphic, a text, a numeric value, a color, a dimension and the like. For example, the graphic may include a shape of an outer frame of the Artboard, etc., and the text may include text content, font, size, color, etc.; and the dimension may include: a dimension of the Artboard, etc. Here, no limitation is made thereto in embodiments of the present disclosure.

In an exemplary embodiment, the act 332 may include act 3321 at which a corresponding panel is generated through a cross-platform development framework based on a Artboard configured by a user in response to a user's operation on a second control displayed on a first configuration interface for generating the panel. The panel generated by the visual configuration system through the cross-platform development framework corresponds to an Artboard configured by the user through the Sketch plug-in in the visual configuration system.

In an exemplary embodiment, the act 332 may further include act 3322 to 3325 after the act 3321.

At act 3322, the generated panel is stored to the panel library.

At act 3323, panel identification information of the generated panel is generated.

At act 3324, Artboard identification information of the Artboard configured by the user is acquired.

At act 3325, an association relationship between the panel identification information of the generated panel and the Artboard identification information of the Artboard configured by the user is established and stored to establish an association relationship between the generated panel and the Artboard configured by the user.

The panel identification information refers to information that may uniquely identify the panel, such as panel id; and the Artboard identification information refers to information that may uniquely identify the Artboard, such as the Artboard id. For example, the panel identification information may include the panel id and panel name information, and the Artboard identification information may include the Artboard id and Artboard name information. Here, no limitation is made thereto in embodiments of the present disclosure.

In this way, in a process of generating a corresponding panel according the Artboard configured by a user, the visual configuration system also stores an association relationship between the panel identification information and the Artboard identification information (for example, an association relationship between the panel id and the Artboard id) in addition that the generated panel is stored in the panel library. Thus, after all panels corresponding to the design page are produced by the visual configuration system later, since the layout information of the target page parsed by the visual configuration system indicates a layout of the page by the Artboard identification information, on the one hand, it may be convenient for the microprogram center to match multiple panels corresponding to the design page from the panel library according to the parsed layout information of the target page and the pre-stored association relationship between the panel identification information and the Artboard identification information; and on the other hand, it may be convenient for the microprogram center to add multiple panels corresponding to the design page to microprogram templates according to the layout information of the target page to automatically splice multiple panels and produce a microprogram capable of achieving the target page corresponding to the design page.

In an exemplary embodiment, the act 3323 may include: acquiring pre-stored microprogram identification information of a microprogram; calculating a hashed value of the microprogram identification information through a hash function; and splicing the hash value of the microprogram identification information, preset special characters and digital numbers to generate Artboard identification information of the Artboard.

Herein, the microprogram identification information refers to information that may uniquely identify the microprogram. For example, the microprogram identification information may include a microprogram name or a microprogram id or the like. For example, the microprogram identification information may be preset by a user through the visual configuration system. Here, no limitation is made thereto in embodiments of the present disclosure.

For example, the hash function may adopt MD5 (Message-Digest Algorithm 5), and correspondingly, the hash value of the microprogram identification information may adopt MD5 codes of the microprogram identification information. For example, taking the microprogram identification information including the microprogram id as an example, the MD5 code of the microprogram identification information may adopt an MD5 code of the microprogram id. Here, no limitation is made thereto in embodiments of the present disclosure.

For example, the preset special characters may adopt a delimiter, an asterisk, an underscore, etc. Here, no limitation is made thereto in embodiments of the present disclosure.

For example, taking a case where the hash function adopts MD5 and preset special characters adopt the underscore as an example, a process of generating the panel identification information by the visual configuration system may include: splicing the MD5 code of the microprogram identification information, "the preset special characters" and "the digital numbers" to obtain the panel identification information. For example, taking a case where the microprogram identification information includes the microprogram id as an example, the panel id of a certain panel=the MD5 code of the microprogram id+the underscore "_"+digital numbers "001".

Figure 4:
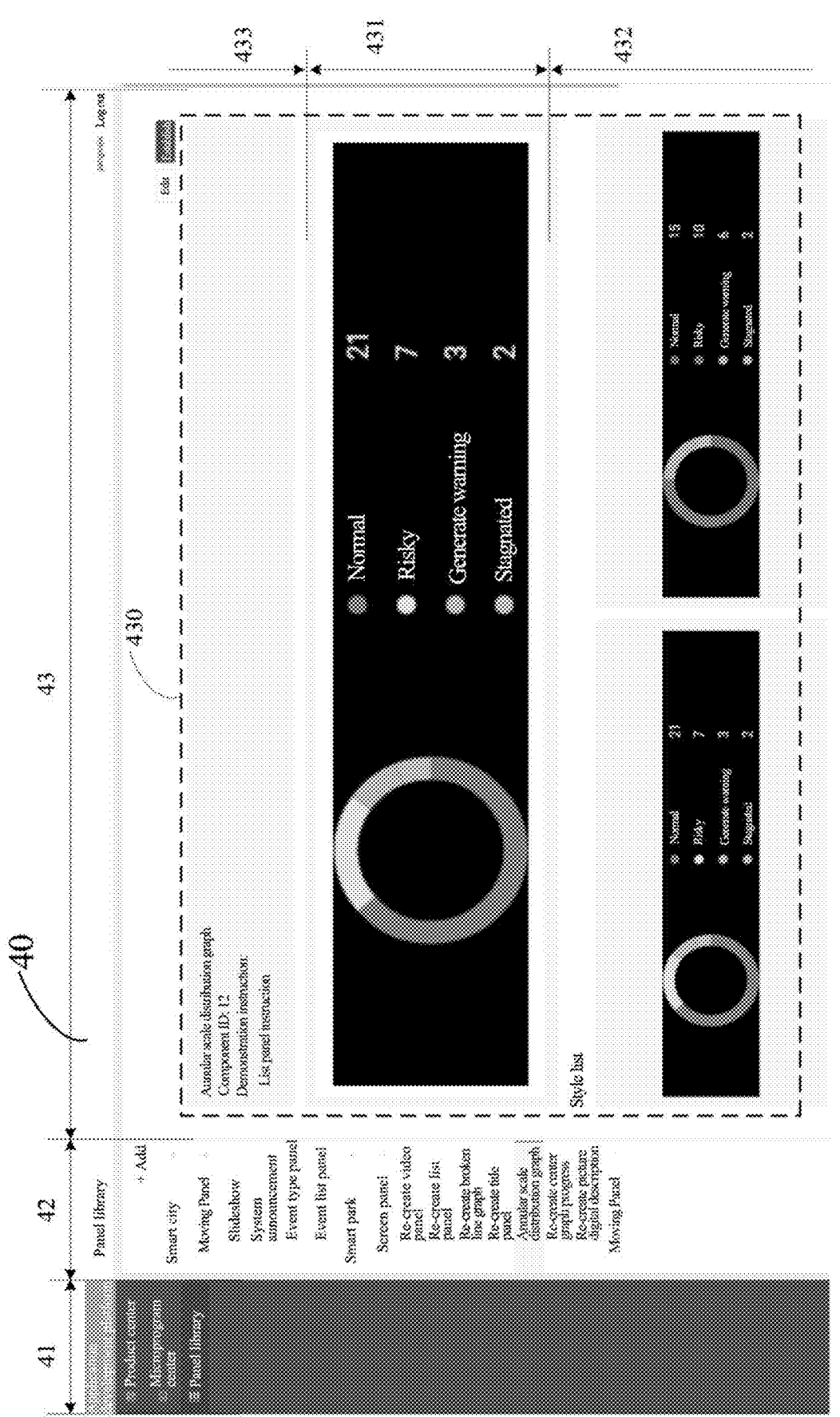
FIG. 4 is a schematic diagram of a second configuration interface provided by an application development platform according to an exemplary embodiment of the present disclosure.
Figure 5:
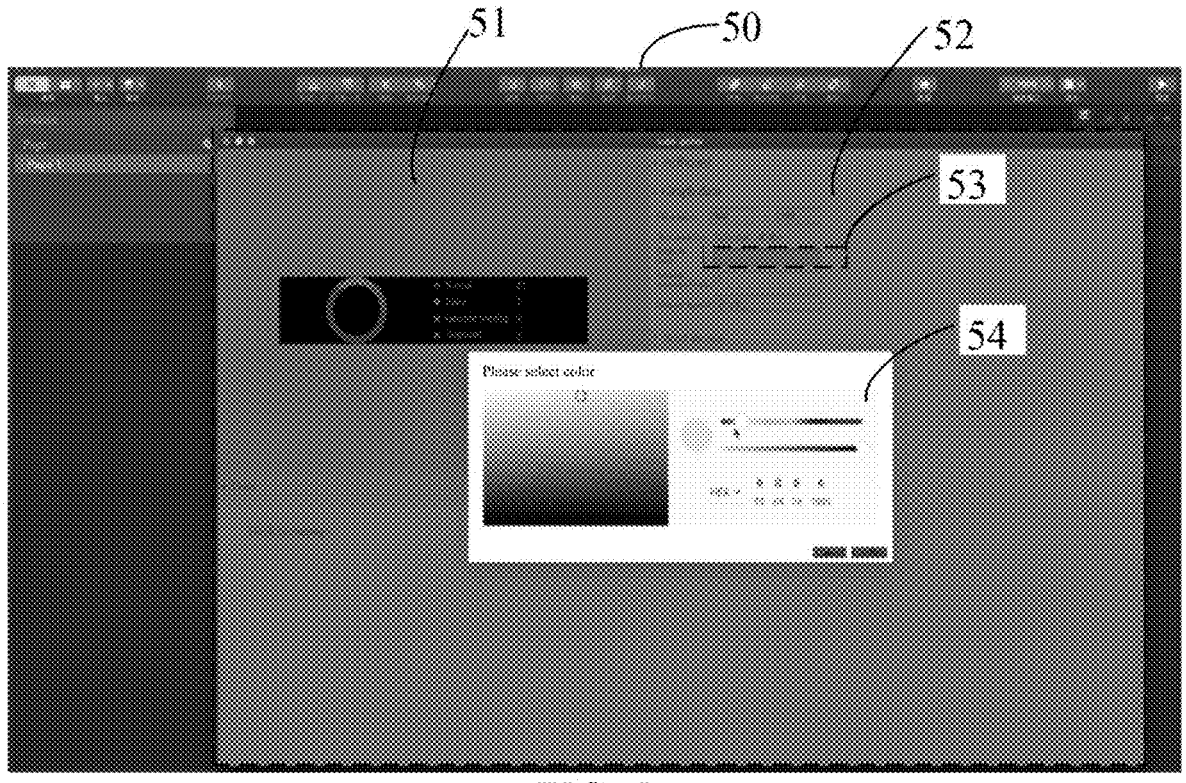
FIG. 5 is a first schematic diagram of a first configuration interface provided by an application development platform according to an exemplary embodiment of the present disclosure.
Figure 6:
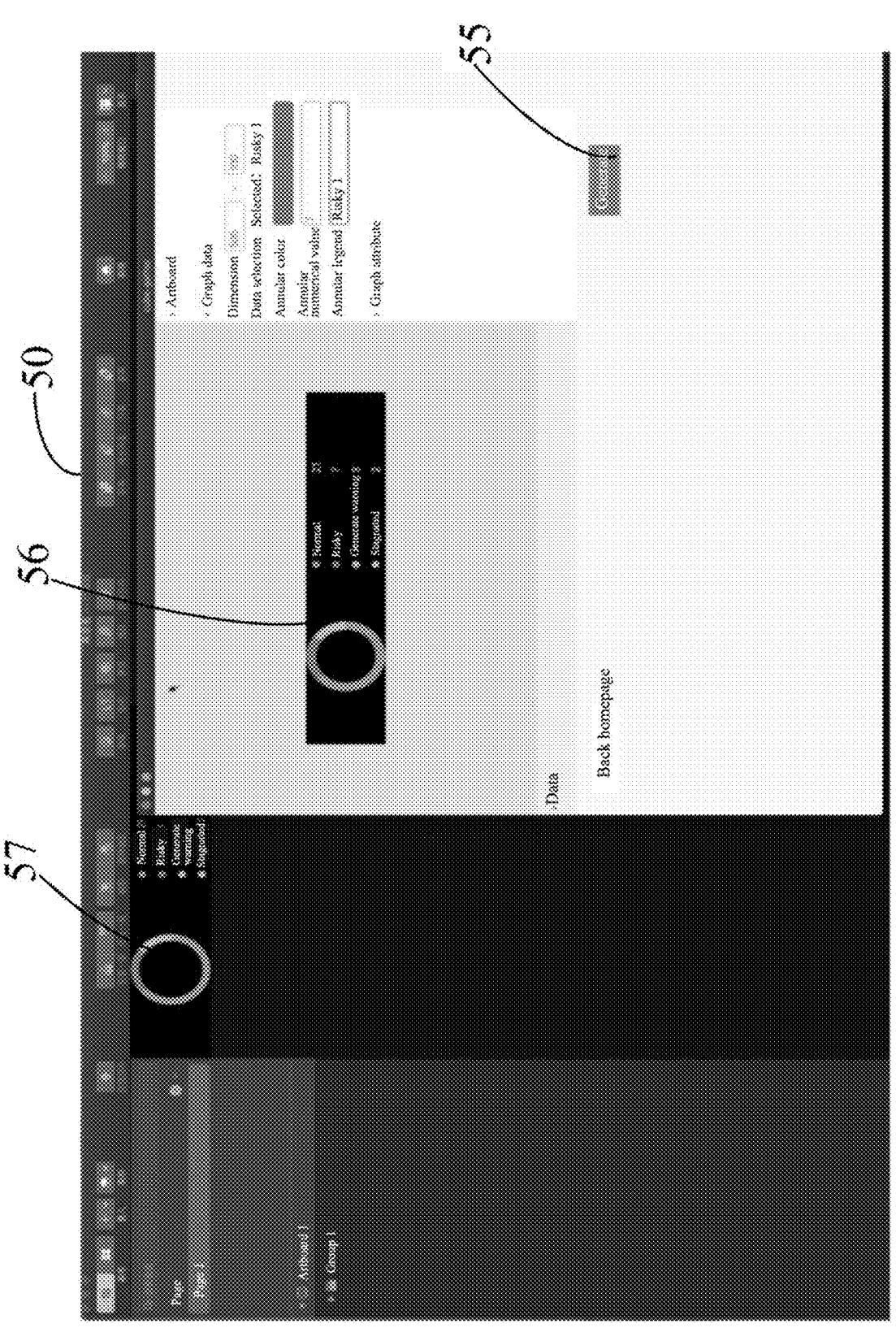
FIG. 6 is a second schematic diagram of a first configuration interface provided by an application development platform according to an exemplary embodiment of the present disclosure.

A process of generating the panel in combination with the accompanying drawings is illustrated below by taking a case where the design page is the design page of the smart park shown in FIG. 2, and the user produces the first annular scale distribution graph panel 202 corresponding to the design page of the smart park shown in FIG. 2 through the visual configuration system as an example. FIG. 4 is a schematic diagram of a second configuration interface provided by an application development platform according to an exemplary embodiment of the present disclosure. FIG. 5 is a first schematic diagram of a first configuration interface provided by an application development platform according to an exemplary embodiment of the present disclosure. FIG. 6 is a second schematic diagram of a first configuration interface provided by an application development platform according to an exemplary embodiment of the present disclosure.

In practical applications, users may visually configure products such as panels, pages, microprograms through a configuration interface provided by the visual configuration system.

A process of visually configuring a panel may include the following acts.

(1) A function list may be provided in the second configuration interface provided by the application development platform, and the function list may include a tab for viewing the product center, a tab for viewing the microprogram center, and a tab for viewing the panel library. In this way, after the visual configuration system presents the second configuration interface, the user may select a panel to be modified on the second configuration interface from the panel library presented by the second configuration interface. Thereby, it is convenient for the user to visually configure an Artboard to be modified corresponding to the panel to be modified that is selected by the user through the Sketch plug-in in the visual configuration system, so as to produce the first annular scale distribution graph panel 202.

For example, as shown in FIG. 4, the visual configuration system may provide a function list in the first region 41 of the second configuration interface 40. After the user selects the tab for viewing the panel library from the function list, the visual configuration system may provide a panel list in the second region 42 of the first configuration interface, and the panel list may include multiple tabs for viewing panels. After the user selects the tab for viewing the annular scale distribution graph from the panel list, the visual configuration system may present an annular scale distribution graph panel of a default style or an annular scale distribution graph panel selected by the user in a zoom-in manner in a first region 431 of the third region 43, and present an annular scale distribution graph panel list in a zoom-out manner in a second region 432 of the third region 43, wherein the annular scale distribution graph panel list may include multiple annular scale distribution graph panels of different styles. The annular scale distribution graph panel may include information such as graphics, legends, data types and numerical values of the annular scale distribution graph. Here, FIG. 4 is illustrated by taking annular scale distribution graph panels of two styles in the annular scale distribution graph panel list as an example. When there are annular scale distribution graph panels of at least three styles in the annular scale distribution graph panel list, the visual configuration system presents annular scale distribution graph panels of other styles in the annular scale distribution graph panel list on the second configuration interface 40 through dragging, by the user, a control of the second configuration interface 40. In addition, the visual configuration system may display basic information of the annular scale distribution graph panel, such as a component ID of a component to which the annular scale distribution graph panel is bound, or description information of the annular scale distribution graph panel, or other information, in a third region 433 of the third region 43. Here, no limitation is made thereto in embodiments of the present disclosure.

For example, the user can select the tab for viewing the panel library by clicking on the tab for viewing the panel library in the function list. Of course, the user may also select the tab for viewing the panel library by other operations, which are not limited herein by the embodiments of the present disclosure.

(2) After the user selects a panel of a certain style as a panel to be modified in the second configuration interface, the visual configuration system may present a first configuration interface for configuring the panel, and present an Artboard to be modified corresponding to the panel to be modified in the first configuration interface, so that the user may modify the Artboard to be modified through the visual configuration system to produce an Artboard of a new style (i.e., the Artboard configured by the user), and thus, the visual configuration system may generate a corresponding panel configured by the user according to the Artboard configured by the user. In addition, after obtaining the panel configured by the user, the visual configuration system may upload the Artboard configured by the user to the panel library.

For example, after the user selects the panel to be modified, as shown in FIG. 5, the visual configuration system may display an Artboard 51 to be modified that is corresponding to the panel to be modified, modifiable parameters 52 of the Artboard to be modified, and a first control 53 for modifying parameter values of the modifiable parameters 52 through the Sketch plug-in in the first configuration interface 50. In this way, the user may operate the first control 53 corresponding to the modifiable parameters 52 of the Artboard to be modified to modify the parameter values of the modifiable parameters 52 of the Artboard to be modified. For example, the first control 53 may include, but is not limited to, an input control (such as a text box), or a selection control (such as a list as follows), or the like. For example, the modifiable parameters of the Artboard to be modified may include, but are not limited to, one or more of a graphics, a text numeric value, a color, a dimension and a data source. For example, taking an Artboard corresponding to the annular scale distribution graph panel as an example, the graphic information may include, but is not limited to, annular dimension information, annular data selection information, annular color information, annular numerical value information, annular legend information, and the like.

For example, taking a case where the user selects to modify the annular color information of the Artboard 51 to be modified and adopts the first control 53 for modifying the annular color information as the selection control as an example, as shown in FIG. 5, after the user clicks on the first control 53 for modifying the annular color information in the modifiable parameters 52 of the Artboard 51 to be modified corresponding to the annular scale distribution graph panel, the visual configuration system may provide a pop-up window 54 for selecting the color information in the first configuration interface 50, so that the user may modify the annular color information of the Artboard 51 to be modified by operating the pop-up window 54.

(3) After the user modifies the annular color information of the Artboard 51 to be modified through the first configuration interface 50 provided by the visual configuration system, the visual configuration system may generate and present the Artboard 56 configured by the user according to the parameter values of the modifiable parameters of the Artboard to be modified and the modified parameter values. In addition, the visual configuration system may display a second control 55 for generating a panel on the first configuration interface, so as to generate a corresponding panel according to an Artboard configured by the user in response to a user's operation. After obtaining the panel configured by the user, the visual configuration system may upload the panel configured by the user to the panel library, so that the panel configured by the user may enter the panel list on the second configuration interface 40.

For example, as shown in FIG. 6, the visual configuration system may further provide a group 57 corresponding to the modified Artboard on the first configuration interface 50 in addition providing the modified Artboard 56 and modifiable parameters of the modified Artboard and their parameter values on the first configuration interface 50.

The visual configuration system may provide a page list, an Artboard list and a group list on the first configuration interface, wherein the page list may include at least one tab for viewing a page, the Artboard list may include at least one tab for viewing an Artboard, and the group list may include at least one tab for viewing a group. For example, as shown in FIG. 6, the visual configuration system may provide a page list on the first configuration interface 50, and the page list may include: at least one tab for viewing a page; after a user selects a certain tab for viewing a page from the page list, the visual configuration system may provide an Artboard list corresponding to the page on the first configuration interface 50, and the Artboard list may include: at least one tab for viewing an Artboard; after the user selects a certain tab for viewing an Artboard from the Artboard list corresponding to the page, the user may visually configure the panel drawn on the Artboard via the first configuration interface 50 to form the configured panel, and the visual configuration system may provide a group corresponding to the configured panel on the first configuration interface 50, and associate the Artboard with the group corresponding to the configured panel. After that, the user may see a tab for viewing the group corresponding to the configured panel in the group list corresponding to the Artboard. In this way, the visual configuration system can achieve the visual configuration of the user from multiple dimensions such as page, Artboard, and group by providing the first configuration interface 50.

So far, the process of quickly generating a panel through the visual configuration system is completed.

Of course, the user may also directly produce the panel corresponding to the design page through the Sketch plug-in in the visual configuration system in addition to generating the panel corresponding to the design page in the way listed above. For example, when there are many differences between a style of the panel in the panel library and a style of the design page, the user has to do more modification operations, and the user may directly configure the Artboard through the visual configuration system, so that the visual configuration system generates the corresponding panel. Here, no limitation is made thereto in embodiments of the present disclosure.

For example, when there are multiple similar panels corresponding to the design page of the smart park shown in FIG. 2 in the panel library, the user may repeat the above process and make a few modifications to the multiple similar panels respectively to quickly generate multiple panels corresponding to the design page of the smart park shown in FIG. 2.

Figure 7:
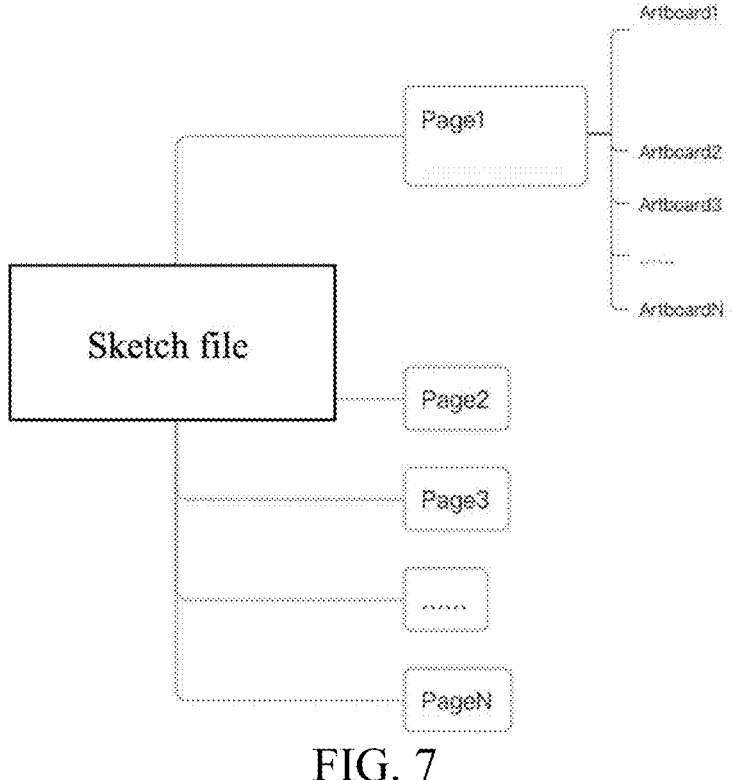
FIG. 7 is a schematic diagram of an architecture of a Sketch file according to an exemplary embodiment of the present disclosure.

In an exemplary embodiment, one Sketch file may include layout information corresponding to one or more pages, each page may include one or more Artboards (corresponding to panels). For example, as shown in FIG. 7, the Sketch file may include N pages, which include Page1 to Page N, wherein Page 1 may include Artboard 1 (corresponding to panel 1) to Artboard N (corresponding to panel N), i.e. Page 1 may include N panels, and N is a positive integer greater than 1. FIG. 7 is illustrated by taking a case where the Sketch file includes N pages and Page1 includes N panels as an example.

In an exemplary embodiment, the act 34 may include act 341, at which the Sketch file of the design page is parsed by a preset SketchTool command statement, to obtain layout information of a target page corresponding to the design page.

In an exemplary embodiment, the preset SketchTool command statement may include, but is not limited to, a command statement of sketchtool list artboards, and a command statement of sketchtool list layers, and the like. Here, no limitation is made thereto in embodiments of the present disclosure.

In an exemplary embodiment, taking a case where the preset SketchTool command statement includes the command statement of sketchtool list artboards and the command statement of SketchTool list layers as an example, the act 341 may include: information of all Artboards in the target page may be exported from the Sketch file of the design page through the SketchTool in the visual configuration system by executing the command statement of sketchtool list artboards, so that first layout information of the target page is obtained; and next, for each Artboard in the target page, layer information corresponding to each Artboard in the target page may be exported from the Sketch file of the design page through the SketchTool in the visual configuration system by executing the command statement of sketchtool list layers, so that second layout information of the target page is obtained. Thus, the layout information of the target page is obtained.

In an exemplary embodiment, the first layout information of the target page may include, but is not limited to, page identification information, page parameter information, Artboard identification information or Artboard parameter information, etc. For example, as shown in FIG. 8A, the page identification information may include a page id and a page name (name), and the page parameter information may include page bound information, which may include coordinate information of a vertex in the upper left corner of the page (denoted as an origin), a page width and a page length. The Artboard identification information may include an Artboard id and an Artboard name, etc., and the Artboard parameter information may include coordinate information (x, y) of a vertex in the upper left corner, an Artboard width and an Artboard length (height), etc. The illustrative embodiments of the present disclosure are not limited thereto. FIG. 8A is illustrated by taking two panels (corresponding to two Artboards) in a target page named "Page 1" as an example.

In an exemplary embodiment, the second layout information of the target page may include, but is not limited to, Artboard identification information, Artboard parameter information, layer identification information, or layer parameter information, etc. For example, as shown in FIG. 8B, the layer identification information may include a layer id and a layer name (name), and the like, and the layer parameter information may include coordinate information (x, y) of a vertex in the upper left corner of the layer, a layer width and a layer length (height), and the like. The illustrative embodiments of the present disclosure are not limited thereto. FIG. 8B is illustrated with partial layer information in an Artboard named "Park iCONS" in the target page.

In an exemplary embodiment, the act 35 may include: splicing multiple panels according to the layout information of the target page, panel identification information of multiple panels corresponding to the design page, and a pre-stored association relationship between the panel identification information and the Artboard identification information, to generate a microprogram for implementing the target page.

In this way, since the visual configuration system may also store the association relationship between the panel identification information and the Artboard identification information in addition to storing the generated panel into the panel library, in the process of generating the corresponding panel according to the Artboard configured by the user, the microprogram center may match multiple panels corresponding to the design page from the panel library according to the Artboard identification information in the layout information corresponding to the page obtained by parsing and the pre-stored association relationship between the panel identification information and the Artboard identification information after the user produces all panels of the page through the visual configuration system. Then, the microprogram center may add multiple panels to the microprogram template for automatic splicing according to the layout information of the target page corresponding to the design page, thereby producing a corresponding microprogram, so that later the product center generates the corresponding application based on the microprogram in response to the instruction for generating the application.

In an exemplary embodiment, prior to the act 35, the method for generating a microprogram may further include: act 36 at which, a binding processing is performed on the panel in response to a binding operation of a user for the panel, wherein performing the binding processing on the panel includes at least one of performing a data binding on the panel, performing an event binding on the panel, and performing a component binding on the panel. In this way, the function of visually configuring the panel through the visual configuration system can be achieved.

In an exemplary embodiment, the binding operation may include, but is not limited to, user's operations such as a click operation, a drag operation or an input operation. Here, no limitation is made thereto in embodiments of the present disclosure.

In an exemplary embodiment, performing the data binding on the panel may mean binding panel contents to the panel. For example, the user may manually input the data presented in the panel through the visual configuration system, or the user may bind the data provided by other data servers to the panel through the visual configuration system, for example, inputting title text to a title panel, and for example, binding multiple data sources to a broke line graph panel and so on. Here, no limitation is made thereto in embodiments of the present disclosure.

In an exemplary embodiment, performing an event binding on a panel may mean binding a jump event or a click event or the like to a panel. Here, no limitation is made thereto in embodiments of the present disclosure.

In an exemplary embodiment, one panel may be bound to one or more components.

In an exemplary embodiment, a component (also referred to as a control) has a function of execution or a function of triggering code to run and complete a response through an "event", such as a function of performing an interaction with a user. For example, the component may include, but is not limited to, a drop-down list box, a text input box, a button, a navigation bar (TabBar), a scroll bar, or a check box, etc. Here, no limitation is made thereto in embodiments of the present disclosure.

For example, taking a case where a component is bound to the panel to control the presentation of the panel as an example, as shown in FIG. 2, a drop-down list box may be bound to the broke line graph panel 201, so that in a process of using the application, the user viewing the broke line graph may select the data, that the user is more concerned about, through the drop-down list box, so that the broke line graph panel only presents the data that the user is more concerned about.

Figure 9:
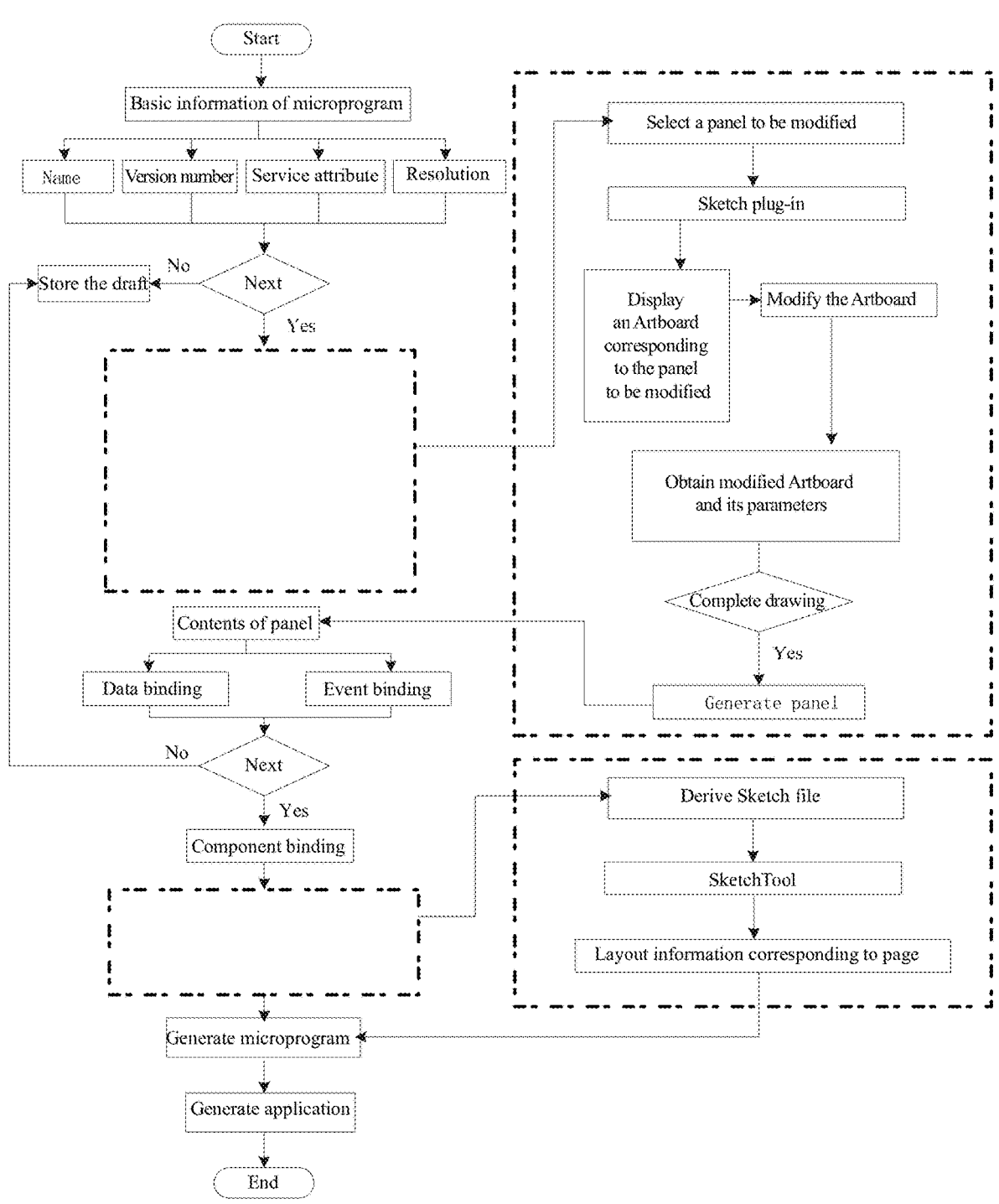
FIG. 9 is a second schematic flowchart of a method for generating a microprogram according to an exemplary embodiment of the present disclosure.

FIG. 9 is a second schematic flowchart of a method for generating a microprogram according to an exemplary embodiment of the present disclosure. As shown in FIG. 9, the method for generating a microprogram may include the following acts.

(1) An engineering template is constructed and basic information of the microprogram to be generated is set through the microprogram center. For example, the basic information may include: name, version number, application type, resolution, or business attribute, or the like.

(2) Whether to perform a process of generating a microprogram is determined through the the microprogram center. If not, draft data of the microprogram is stored. If yes, the following process of generating a microprogram is performed.

(3) A second configuration interface for presenting a panel library is presented through the visual configuration system, and a panel to be modified that is selected by a user from the panel library on the second configuration interface is acquired. Herein, a style of the panel to be modified is similar to that of the design page.

(4) A first configuration interface is presented through the Sketch plug-in in the visual configuration system, an Artboard to be modified corresponding to the panel to be modified is displayed on the first configuration interface, and modifiable parameters of the Artboard to be modified and a corresponding first control for modifying parameter values of the modifiable parameters are displayed on the first configuration interface, so that a user may modify the Artboard.

(5) The Artboard configured by the user is generated and presented according to the parameter values of the modifiable parameters of the Artboard to be modified and the modified parameter values in response to the user's operation on the first control through the Sketch plug-in in the visual configuration system.

(6) The corresponding panel is generated through a cross-platform development framework based on the Artboard configured by the user in response to the user's operation on the second control for generating the panel displayed on the first configuration interface through the Sketch plug-in in the visual configuration system.

So far, the process of generating panels corresponding to the design page is completed through visual configuration of the user using the visual configuration system. The panels generated by the visual configuration system may be stored in the panel library for subsequent generation of a corresponding microprogram.

(7) The Sketch file of the design page is imported through the microprogram center.

(8) The Sketch file of the design page is parsed through the SketchTool in the visual configuration system to obtain layout information of the target page corresponding to the design page.

In this way, a process of obtaining the layout information of the target page corresponding to the design page by parsing the Sketch file is completed.

(9) For at least one of multiple panels corresponding to the design page generated by the visual configuration system, at least one of event binding, data binding and component binding is performed on the at least one panel through the visual configuration system to improve the function of the at least one panel. Herein, the event binding may include: binding jump time or a click event, etc., the data binding may include: manually inputting data or pulling data from server interface for the data binding, and the component binding may include: binding a drop-down list box, a text input box, a button, a navigation bar (TabBar), a scroll bar or a check box, etc.

(10) Multiple panels corresponding to the design page configured by the user are spliced based on the layout information of the target page corresponding to the design page through the microprogram center to generate a microprogram capable of achieving the target page. Herein, a data format of the microprogram may be a DSL-JSON data format, and the DSL-JSON file of the microprogram may include, but is not limited to, basic information of the microprogram, JSON data of all panels in the page (that is, strings describing the panels), layout information of the panels, layout information of the page, and screenshots of visual configuration of the microprogram.

So far, the process of generating a microprogram is completed, and the generated microprogram may be stored in the microprogram center for subsequent generation of a corresponding cross-platform application.

(11) When an application is created through the product center, a corresponding microprogram may be selected to generate a cross-platform application through automatic package. Herein, the cross-platform application generates target pages suitable for different operating systems when they are run in the different operating systems. For example, the cross-platform application refers to an application suitable for platforms such as iOS, Android, Web, Windows, macOS, or Linux. In this way, the process of transforming a microprogram into an application is achieved.

The description of the above application scenario embodiments is similar to the description of the above method embodiments for generating a microprogram, and has similar beneficial effects as the method embodiments. Technical details not disclosed in the application scenario embodiments of the present disclosure may be understood by those skilled in the art with reference to the description in method embodiments of the present disclosure, and will not be repeated here.

An embodiment of the present disclosure also provides a computer device. The computer device may include a processor and a memory storing a computer program that is runnable on the processor, wherein acts of the method for generating a microprogram in one or more of the above exemplary embodiments are implemented when the processor executes the computer program.

Figure 10:
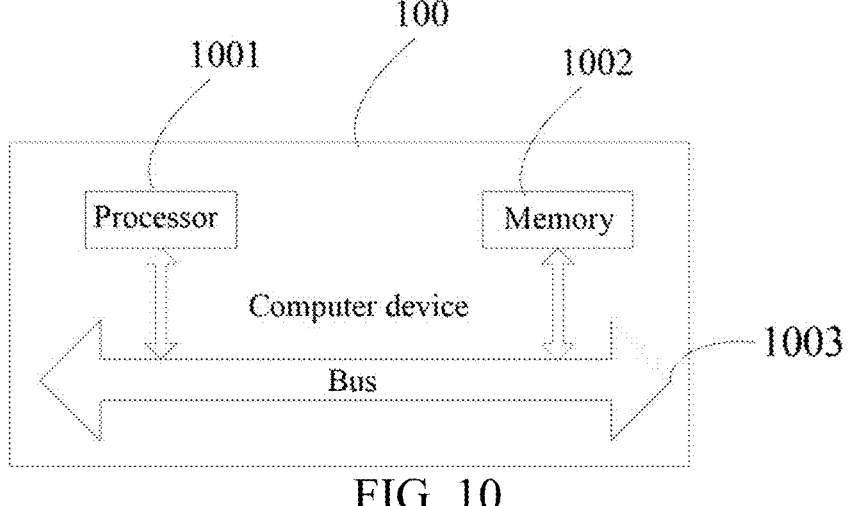
FIG. 10 is a schematic diagram of a structure of a computer device according to an exemplary embodiment of the present disclosure.

In an exemplary embodiment, as shown in FIG. 10, the computer device 100 may include at least one processor 1001, at least one memory 1002 connected to the processor 1001, and a bus 1003. The processor 1001 and the memory 1002 communicate with each other through the bus 1003. The processor 1001 is configured to call the program instructions in the memory 1002 to implement the acts of the method for generating a microprogram in one or more of the above exemplary embodiments.

In an exemplary embodiment, the above processor may be a Central Processing Unit (CPU), another general purpose processor, a Digital Signal Processor (DSP), a Field Programmable Gate Array (FPGA) or another programmable logic device, a discrete gate or a transistor logic device, a discrete hardware component, an application specific integrated circuit, etc. The general-purpose processor may be a microprocessor (Micro Processor Unit, MPU) or any conventional processor, or the like. Here, no limitation is made thereto in embodiments of the present disclosure.

In an exemplary embodiment, the memory may include a non-permanent memory, Random Access Memory (RAM) and/or non-volatile memory, in a computer-readable storage medium, etc., such as a Read Only Memory (ROM) or Flash RAM, and the memory includes at least one memory chip. Here, no limitation is made thereto in embodiments of the present disclosure.

In an exemplary embodiment, in addition to a data bus, the bus may include a power bus, a control bus, a status signal bus, and the like. However, for clarity of illustration, various buses are labeled as the bus 1003 in FIG. 10. Here, no limitation is made thereto in embodiments of the present disclosure.

In an implementation process, the processing performed by the computer device may be completed by an integrated logic circuit of hardware in the processor or instructions in the form of software. That is, the acts of the method in the embodiments of the present disclosure may be embodied to be executed and completed by a hardware processor, or executed and completed by a combination of hardware in the processor and a software module. The software module may be located in a storage medium such as a random access memory, a flash memory, a read only memory, a programmable read-only memory, or an electrically erasable programmable memory, or a register, etc. The storage medium is located in the memory, and the processor reads information in the memory and completes the acts of the foregoing methods in combination with hardware thereof. In order to avoid repetition, detailed description is not provided herein.

An embodiment of the present disclosure also provides a computer-readable storage medium including a stored program, wherein the acts of the method for generating a microprogram in one or more of the above exemplary embodiments are implemented while the program is run. For example, the device where the storage medium resides is controlled to perform the acts of the method for generating a microprogram in one or more of the above exemplary embodiments while the program is run.

In an exemplary embodiment, the above computer-readable storage medium may include, but is not limited to: ROM/RAM, magnetic disk or optical disk or the like. Here, no limitation is made thereto in embodiments of the present disclosure.

The above description of the embodiments of the computer device or computer readable storage medium is similar to the description of the above embodiments of the method, and has similar beneficial effects as the above embodiments of the method. Technical details not disclosed in embodiments of the computer device or computer readable storage medium of the present disclosure may be understood by those skilled in the art with reference to the description of embodiments of the method of the present disclosure, and will not be repeated here.

It may be understood by those of ordinary skills in the art that all or some acts in the method, and function modules/units in the system and the apparatus disclosed above may be implemented as software, firmware, hardware, and appropriate combinations thereof. In a hardware implementation, division of the function modules/units mentioned in the above description is not always corresponding to division of physical components. For example, a physical component may have multiple functions, or a function or an act may be executed by several physical components in cooperation. Some components or all components may be implemented as software executed by a processor such as a digital signal processor or a microprocessor, or implemented as hardware, or implemented as an integrated circuit such as an application specific integrated circuit. Such software may be distributed in a computer-readable medium, and the computer-readable medium may include a computer storage medium (or a non-transitory medium) and a communication medium (or a transitory medium). As known to those of ordinary skills in the art, the term computer storage medium includes volatile and nonvolatile, and removable and irremovable media implemented in any method or technology for storing information (for example, a computer-readable instruction, a data structure, a program module, or other data). The computer storage medium includes, but is not limited to, a RAM, ROM, EEPROM, flash memory or another memory technology, CD-ROM, digital versatile disk (DVD) or another optical disk storage, magnetic cassette, magnetic tape, a magnetic disk storage, or another magnetic storage apparatus, or any other medium that may be configured to store desired information and may be accessed by a computer. In addition, it is known to those of ordinary skills in the art that the communication medium usually includes a computer-readable instruction, a data structure, a program module, or other data in a modulated data signal of, such as, a carrier or another transmission mechanism, and may include any information delivery medium.

Although the embodiments disclosed in the present disclosure are described as above, the described contents are only embodiments which are adopted in order to facilitate understanding of the present disclosure, and are not intended to limit the present disclosure. Any skilled person in the art to which the present invention pertains can make any modifications and alterations in forms and details of implementations without departing from the spirit and scope of the present disclosure. However, the patent protection scope of the present disclosure should be subject to the scope defined by the appended claims.

The invention claimed is:

1. An application development platform, comprising a microprogram center and a visual configuration system,
   wherein the microprogram center is configured to obtain a Sketch file of a design page;
   the visual configuration system is configured to present a first configuration interface for configuring a panel, acquire a plurality of panels which correspond to the design page and are configured by a user via the first configuration interface, parse the Sketch file to obtain layout information of a target page corresponding to the design page; and
   the microprogram center is further configured to splice the plurality of panels based on the layout information of the target page, and generate a microprogram capable of achieving the target page,
   wherein the visual configuration system is configured to, on the first configuration interface, acquire an Artboard configured by the user through a Sketch plug-in, generate a corresponding panel through a cross-platform development framework according to the Artboard configured by the user; wherein a style of the Artboard is the same as a style of the corresponding panel, the Artboard is a page component based on Sketch, the panel is a page component based on the cross-platform development framework, and the target page is a page based on the cross-platform development framework, and
   the application development platform further comprising:
   a panel library,
   wherein the panel library is configured to store panels; and
   the visual configuration system is configured to present a second configuration interface for presenting the panel library, acquire a panel to be modified that is selected by the user from the panel library on the second configuration interface, display an Artboard to be modified corresponding to the panel to be modified on the first configuration interface through the Sketch plug-in, and generate and present the Artboard configured by the user in response to a user's operation for modifying the Artboard to be modified on the first configuration interface.

2. The application development platform according to claim 1, wherein the visual configuration system is configured to display modifiable parameters of the Artboard to be modified and a corresponding first control for modifying parameter values of the modifiable parameters on the first configuration interface, generate and present the Artboard configured by the user according to the parameter values of the modifiable parameters of the Artboard to be modified and modified parameter values in response to a user's operation performed on the first control; wherein the modifiable parameters comprise one or more of a graphic, a text, a numeric value, a color, a dimension, and a data source.

3. The application development platform according to claim 1, wherein the visual configuration system is configured to, in response to a user's operation performed on a second control displayed on the first configuration interface for generating a panel, generate a corresponding panel through the cross-platform development framework based on the Artboard configured by the user.

4. The application development platform according to claim 1, wherein the visual configuration system is configured to, prior to generation of the microprogram, in response to a binding operation performed by the user on the panel, perform a binding processing on the panel, wherein performing the binding processing on the panel comprises at least one of performing a data binding on the panel, performing an event binding on the panel, and performing a component binding on the panel.

5. The application development platform according to claim 1, further comprising: a product center configured to acquire one or more microprograms from the microprogram center, and generate a cross-platform application based on the one or more microprograms; wherein the cross-platform application generates target pages suitable for different operating systems when the cross-platform application is run on different operating systems.

6. The application development platform according to claim 1, wherein the microprogram center is configured to splice the plurality of panels based on the layout information of the target page, panel identification information of the plurality of panels corresponding to the design page, and a pre-stored association relationship between panel identification information and Artboard identification information, and generate the microprogram capable of achieving the target page.

7. The application development platform according to claim 1, wherein the sketch file of the design page refers to a file of the design page in a format of .sketch.

8. The application development platform according to claim 1, wherein description data of an Artboard adopts a JSON data format, and description data of a panel adopts a JSON data format.

9. A method for generating a microprogram, applied to an application development platform, the method comprising:
   obtaining a Sketch file of a design page;
   presenting a first configuration interface for configuring a panel;
   acquiring a plurality of panels which correspond to the design page and are configured by a user via the first configuration interface;
   parsing the Sketch file to obtain layout information of a target page corresponding to the design page; and
   splicing the plurality of panels based on the layout information of the target page, and generating a microprogram capable of achieving the target page,
   wherein the acquiring the plurality of panels which correspond to the design page and configured by the user via the first configuration interface comprises:
   acquiring an Artboard configured by the user on the first configuration interface through a Sketch plug-in; and
   generating a corresponding panel through a cross-platform development framework according to the Artboard configured by the user; wherein a style of the Artboard is the same as a style of the corresponding panel, the Artboard is a page component based on Sketch, the panel is a page component based on the cross-platform development framework, and the target page is a page based on the cross-platform development framework, and
   wherein the acquiring the Artboard configured by the user on the first configuration interface through the Sketch plug-in comprises:
   presenting a second configuration interface for presenting a panel library;
   acquiring a panel to be modified that is selected by the user from the panel library on the second configuration interface;
   displaying an Artboard to be modified corresponding to the panel to be modified on the first configuration interface through the Sketch plug-in; and
   generating and presenting the Artboard configured by the user in response to a user's operation for modifying the Artboard to be modified on the first configuration interface.

10. The method according to claim 9, wherein the generating and presenting the Artboard configured by the user comprises:
   displaying modifiable parameters of the Artboard to be modified and a corresponding first control for modifying parameter values of the modifiable parameters on the first configuration interface;
   generating and presenting the Artboard configured by the user according to the parameter values of the modifiable parameters of the Artboard to be modified and modified parameter values in response to a user's operation performed on the first control; wherein the modifiable parameters comprise one or more of a graphic, a text, a numeric value, a color and a dimension.

11. The method according to claim 9, wherein the generating the corresponding panel through the cross-platform development framework according to the Artboard configured by the user, comprises:
   generating a corresponding panel through the cross-platform development framework based on the Artboard configured by the user in response a user's operation performed on a second control displayed on the first configuration interface for generating a panel.

12. The method according to claim 9, wherein, prior to generation of the microprogram, the method further comprises:
   performing a binding processing on the panel in response to a binding operation performed by the user on the panel, wherein performing the binding processing on the panel comprises at least one of performing a data binding on the panel, performing an event binding on the panel and performing a component binding on the panel.

13. A computer device, comprising: a processor and a memory storing a computer program that is runnable on the processor, wherein steps of the method for generating the microprogram according to claim 9 are implemented when the processor executes the program.

14. A computer-readable non-transitory storage medium comprising a stored program, wherein steps of the method for generating the microprogram according to claim 9 are implemented when the program is run.

15. The method according to claim 9, wherein the splicing the plurality of panels based on the layout information of the target page, and generating a microprogram capable of achieving the target page comprises:
   splicing the plurality of panels based on the layout information of the target page, panel identification information of the plurality of panels corresponding to the design page, and a pre-stored association relationship between panel identification information and Artboard identification information, and generating the microprogram capable of achieving the target page.

16. The method according to claim 9, wherein the sketch file of the design page refers to a file of the design page in a format of .sketch.

* * * * *